United States Patent
Wang et al.

(10) Patent No.: US 12,443,111 B2
(45) Date of Patent: Oct. 14, 2025

(54) PREDICTION DATA SELECTION FOR MODEL CALIBRATION TO REDUCE MODEL PREDICTION UNCERTAINTY

(71) Applicant: ASML NETHERLANDS B.V., Veldhoven (NL)

(72) Inventors: Lei Wang, Los Gatos, CA (US); Yi-Yin Chen, Santa Clara, CA (US); Mu Feng, San Jose, CA (US); Qian Zhao, San Jose, CA (US)

(73) Assignee: ASML NETHERLANDS, Veldhoven (NL)

( * ) Notice: Subject to any disclaimer, the term of this patent is extended or adjusted under 35 U.S.C. 154(b) by 782 days.

(21) Appl. No.: 17/625,125

(22) PCT Filed: Jun. 15, 2020

(86) PCT No.: PCT/EP2020/066446
§ 371 (c)(1),
(2) Date: Jan. 6, 2022

(87) PCT Pub. No.: WO2021/004725
PCT Pub. Date: Jan. 14, 2021

(65) Prior Publication Data
US 2022/0276563 A1    Sep. 1, 2022

Related U.S. Application Data
(60) Provisional application No. 62/872,521, filed on Jul. 10, 2019.

(51) Int. Cl.
G06F 30/398     (2020.01)
G03F 1/36       (2012.01)
(Continued)

(52) U.S. Cl.
CPC .............. *G03F 7/705* (2013.01); *G03F 1/36* (2013.01); *G03F 1/68* (2013.01); *G03F 7/706839* (2023.05)

(58) Field of Classification Search
CPC .. G06F 16/217; G06F 16/2455; G06F 16/248; G06F 16/9035; G06F 16/906;
(Continued)

(56) References Cited

U.S. PATENT DOCUMENTS

| 5,229,872 A | 7/1993 | Mumola |
| 6,046,792 A | 4/2000 | Van Der Werf et al. |

(Continued)

FOREIGN PATENT DOCUMENTS

| CN | 1351721 | 5/2002 |
| KR | 20050021931 | 3/2005 |

(Continued)

OTHER PUBLICATIONS

Taiwanese Office Action issued in corresponding Taiwanese Patent Application No. 110148377, dated Jul. 7, 2022.
(Continued)

*Primary Examiner* — Binh C Tat
(74) *Attorney, Agent, or Firm* — Pillsbury Winthrop Shaw Pittman LLP

(57) ABSTRACT

Systems and methods for reducing prediction uncertainty in a prediction model associated with a patterning process are described. These may be used in calibrating a process model associated with the patterning process, for example. Reducing the uncertainty in the prediction model may include determining a prediction uncertainty parameter based on prediction data. The prediction data may be determined using the prediction model. The prediction model may have been calibrated with calibration data. The prediction uncertainty parameter may be associated with variation in the
(Continued)

prediction data. Reducing the uncertainty in the prediction model may include selecting a subset of process data based on the prediction uncertainty parameter; and recalibrating the prediction model using the calibration data and the selected subset of the process data.

20 Claims, 14 Drawing Sheets

(51) Int. Cl.
  *G03F 1/68* (2012.01)
  *G03F 7/00* (2006.01)
(58) Field of Classification Search
  CPC .... G06F 21/44; G06F 21/6245; G06F 30/398; G06F 30/30; G06F 17/18; G06F 18/24; G06F 30/392; G06F 18/2135; G06F 2119/18; G06F 18/214; G06F 18/24137; G06F 30/20; G06F 30/27; G06F 2119/22; G03F 7/705; G03F 7/70625; G03F 7/70633; G03F 7/70616; G03F 7/70641; G03F 7/70491; G03F 7/70525; G03F 9/7046; G03F 7/70508; G03F 7/70441; G03F 7/70516; G03F 9/7019; G03F 1/84; G03F 7/70258; G03F 9/7023; G03F 9/7069; G03F 9/7073; G03F 7/70683; G03F 1/36; G03F 1/70; G03F 9/7096; G03F 1/68; G03F 7/706839; G03F 1/44; G03F 7/70133; G03F 7/7065; G03F 7/70675; G03F 1/78; G03F 7/70425; G03F 7/70433; G03F 7/7045; G03F 7/70483; G03F 7/70575; G03F 7/706841; G03F 7/70533; G03F 7/70091; G03F 7/706837; G03F 7/70725; H01L 22/12; H01L 21/682; H01L 21/32
  USPC .................................................. 716/50–55
  See application file for complete search history.

(56) References Cited

U.S. PATENT DOCUMENTS

| | | | |
|---|---|---|---|
| 7,473,495 | B2 | 1/2009 | Tanaka et al. |
| 7,587,704 | B2 | 9/2009 | Ye et al. |
| 8,200,468 | B2 | 6/2012 | Ye et al. |
| 9,588,439 | B1* | 3/2017 | Bruguier ............... H01L 21/027 |
| 2006/0266243 | A1* | 11/2006 | Percin ................. G03F 7/70441 |
| | | | 430/30 |
| 2007/0031745 | A1 | 2/2007 | Ye et al. |
| 2007/0050749 | A1 | 3/2007 | Ye et al. |
| 2008/0301620 | A1 | 12/2008 | Ye et al. |
| 2008/0309897 | A1 | 12/2008 | Wong et al. |
| 2009/0157630 | A1 | 6/2009 | Yuan |
| 2009/0182448 | A1 | 7/2009 | Mansfield et al. |
| 2010/0162197 | A1 | 6/2010 | Ye et al. |
| 2010/0180251 | A1 | 7/2010 | Ye et al. |
| 2016/0148850 | A1 | 5/2016 | Stream |
| 2017/0256465 | A1* | 9/2017 | Van Leest ............... H01L 22/12 |
| 2018/0239851 | A1* | 8/2018 | Ypma .................. G03F 7/70516 |
| 2019/0155173 | A1* | 5/2019 | Tsiatmas ............... G06T 7/0006 |
| 2020/0073254 | A1 | 3/2020 | Van Der Schaar et al. |
| 2020/0342333 | A1 | 10/2020 | Sigtermans et al. |

FOREIGN PATENT DOCUMENTS

| | | |
|---|---|---|
| KR | 20180116384 | 10/2018 |
| TW | 201837617 | 10/2018 |

OTHER PUBLICATIONS

International Search Report and Written Opinion issued in corresponding PCT Patent Application No. PCT/EP2020/066446, dated Oct. 20, 2020.
Taiwanese Office Action issued in corresponding Taiwanese Patent Application No. 109121765, dated Jun. 15, 2021.
Office Action issued in corresponding Korean Patent Application No. 10-2022-7000816, dated Jan. 4, 2024.

* cited by examiner

PREDICTION DATA SELECTION FOR MODEL CALIBRATION TO REDUCE MODEL PREDICTION UNCERTAINTY

CROSS-REFERENCE TO RELATED APPLICATIONS

This application is the U.S. national phase entry of PCT Patent Application No. PCT/EP2020/066446 which was filed on Jun. 15, 2020, which claims the benefit of priority of U.S. Provisional Patent Application No. 62/872,521 which was filed on Jul. 10, 2019 and which is incorporated herein in its entirety by reference.

TECHNICAL FIELD

The description herein relates generally to semiconductor manufacturing and patterning processes. More particularly, the description relates to modeling associated with a patterning process.

BACKGROUND

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Thus, manufacturing devices, such as semiconductor devices, typically involve processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced. At the same time, the number of functional elements, such as transistors, per device has been steadily increasing, following a trend commonly referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1 \times \lambda / NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

OPC and other RET utilize robust electronic models that describe the lithography process. Calibration procedures for such lithography models are thus desired that provide valid, robust and accurate models across the process window. Currently, calibration is done using a certain number of 1-dimensional and/or 2-dimensional gauge patterns with wafer measurements. More specifically, the 1-dimensional gauge patterns include line-space patterns with a varying pitch and critical dimension (CD), isolated lines, multiple lines, etc. The 2-dimensional gauge patterns typically include line-ends, contacts, and randomly selected SRAM (Static Random Access Memory) patterns.

SUMMARY

According to an embodiment, there is provided a method for reducing prediction uncertainty in a prediction model associated with a patterning process. The method comprises determining a prediction uncertainty parameter based on prediction data. The prediction data is determined using one or more prediction models associated with the patterning process. A prediction model can be calibrated with calibration data. The prediction uncertainty parameter is associated with variation in the prediction data. The method comprises selecting data based on the prediction uncertainty parameter. Selecting data may include selecting one or more patterns, patterning process data or any other related data for various applications. The selected data may be a subset of patterning process data. The selected data may be used for, recalibrating the prediction model using the calibration data and the selected subset of the patterning process data. In some embodiments, the selected data can be selected patterns for training or calibrating one or more models. The selected patterns may be subject to metrology or inspection by an optical-based or electron-beam based tool, such as a broadband plasma optical inspection tool or a scanning electron microscope (SEM).

In an embodiment, the method comprises iteratively repeating the determining prediction data, determining the prediction uncertainty parameter, selecting, and recalibrating steps until the prediction model converges. In an embodiment, model convergence comprises a model error breaching a model error threshold level. The model error is a difference between a reference geometry and a simulated geometry generated from a simulation of the patterning process by the prediction model. In an embodiment, the reference geometry is a measured geometry from a scanning electron microscope.

In an embodiment, the calibration data comprises a calibration pattern. The calibration pattern is associated with geometrical features of a pattern on a substrate (e.g. a layer of a wafer or other substrates). In an embodiment, the prediction data comprises a prediction pattern. The prediction pattern is associated with predicted geometrical features of the pattern on the substrate.

In an embodiment, the prediction uncertainty parameter is associated with at least one of: a value of critical dimension of a substrate; a curvature associated with a pattern of the patterning process; an intensity used in the patterning process; and an image slope associated with a pattern of the patterning process.

In an embodiment, the prediction data comprises predicted pattern parameter values. The prediction uncertainty parameter is associated with variation in the predicted pattern parameter values. The prediction uncertainty parameter is determined based on the variation in the predicted pattern parameter values and fitting requirements associated with the prediction model. By way of a non-limiting example, the prediction data may comprise predicted critical dimension values. The prediction uncertainty parameter may comprise critical dimension variation. The critical dimension variation may be determined based on variation in the predicted critical dimension values and fitting requirements associated with the prediction model.

In an embodiment, the prediction uncertainty parameter comprises a ranking of individual patterning process data points. In an embodiment, the prediction uncertainty parameter comprises a maximum number of individual patterning process data points.

In an embodiment, the prediction model is a machine learning model, and calibrating the prediction model comprises training the machine learning model.

In an embodiment, recalibrating the prediction model using the calibration data and the selected subset of the patterning process data reduces the prediction uncertainty in predictions from the prediction model.

According to another embodiment, there is provided a method for reducing prediction uncertainty in a prediction model associated with a patterning process. The method comprises determining prediction data using the prediction model. The prediction model is calibrated with calibration data. The method comprises determining a prediction uncertainty parameter based on the prediction data. The prediction uncertainty parameter is associated with variation in the prediction data. The method comprises selecting a subset of patterning process data based on the prediction uncertainty parameter and recalibrating the prediction model using the calibration data and the selected subset of the patterning process data. The method comprises determining one or more semiconductor device manufacturing process parameters based on predictions from the recalibrated prediction model.

In an embodiment, the method comprises iteratively repeating the determining prediction data, determining the prediction uncertainty parameter, selecting, and recalibrating steps until the prediction model converges. In an embodiment, model convergence comprises a model error breaching a model error threshold level. The model error is a difference between a reference geometry and a simulated geometry generated from a simulation of the patterning process by the prediction model. In an embodiment, the reference geometry is a measured geometry from a scanning electron microscope.

In an embodiment, the prediction uncertainty parameter is associated with at least one of: a value of critical dimension of a substrate (e.g. a layer of a wafer or other substrates); a curvature associated with a pattern of the patterning process; an intensity used in the patterning process; and an image slope associated with a pattern of the patterning process. Recalibrating the model uses selected patterns based on the predicted uncertainty parameter.

In an embodiment, the one or more determined semiconductor device manufacturing process parameters comprise one or more of a mask design, a pupil shape, a dose, or a focus.

In an embodiment, the one or more determined semiconductor device manufacturing process parameters comprise a mask design, and the method further comprises adjusting the mask design from a first mask design to a second mask design based on the predictions from the recalibrated prediction model.

In an embodiment, the method further comprises determining an adjustment for a semiconductor device manufacturing apparatus based on the one or more determined semiconductor device manufacturing parameters. In an embodiment, the method comprises determining an adjustment for a semiconductor device manufacturing process based on the one or more determined semiconductor device manufacturing parameters. In an embodiment, the method comprises adjusting the semiconductor device manufacturing apparatus based on the determined adjustment.

In an embodiment, the calibration data comprises a calibration pattern. The calibration pattern is associated with geometrical features of a pattern on a substrate (e.g. a layer of a wafer or other substrates). The prediction data comprises a prediction pattern. The prediction pattern is associated with predicted geometrical features of the pattern on the substrate.

According to another embodiment, there is provided a computer program product comprising a non-transitory computer readable medium having instructions recorded thereon. The instructions, when executed by a computer, implement the operations described above.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
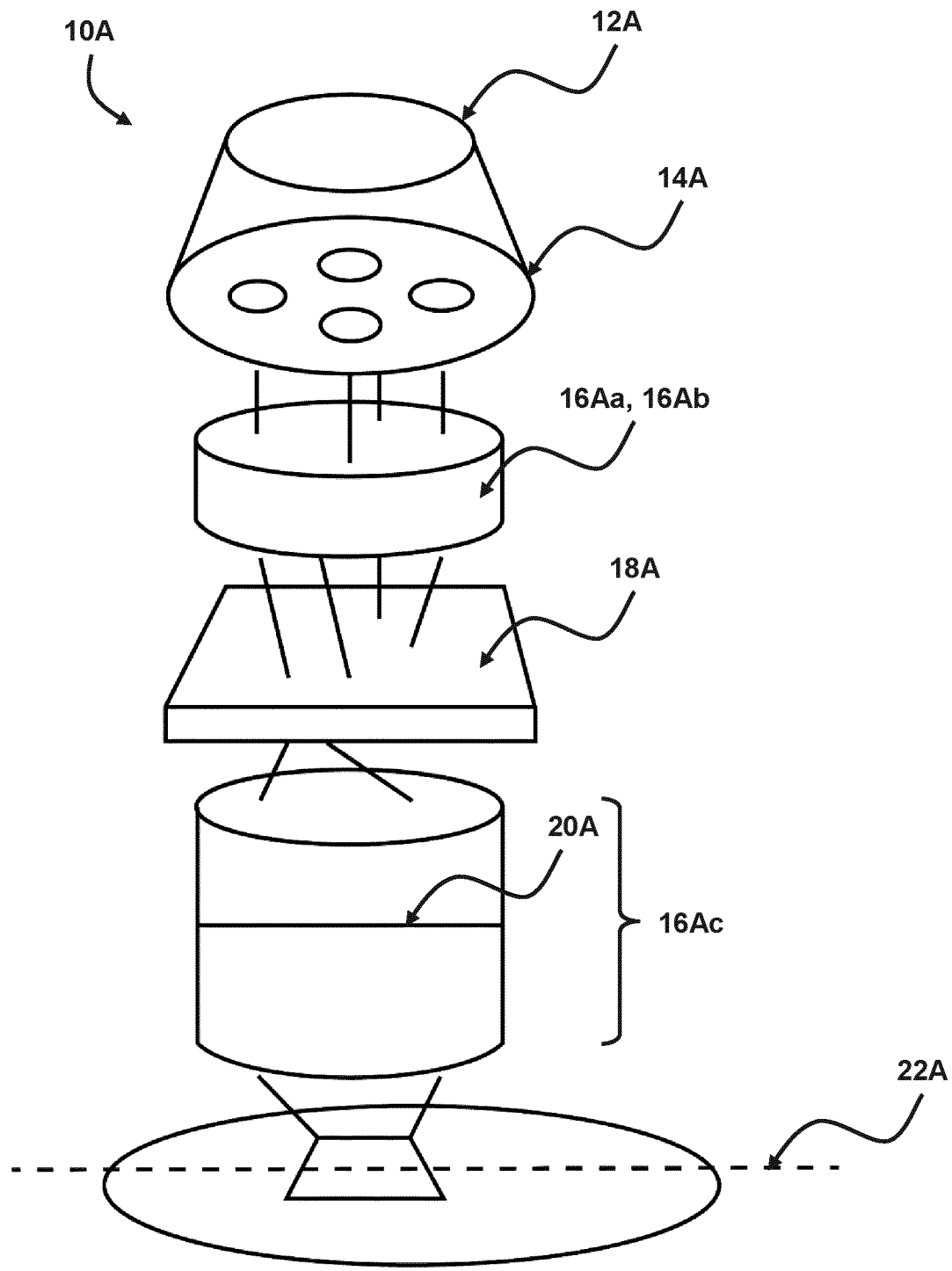
FIG. 1 illustrates a block diagram of various subsystems of a lithographic projection apparatus, according to an embodiment.

With prior electronic prediction (process) models, the certainty of predictions made by the model is not clear. That is, given an input, it is not clear whether prior models generate accurate and consistent output. Prediction (process) models that produce accurate and consistent output are important in an integrated circuit manufacturing process. By way of a non-limiting example, when generating a mask layout from a mask layout design, uncertainties about the predictions of a model may produce uncertainties in a proposed mask layout. These uncertainties may result in questions about the ultimate functionality of a wafer, for example. More uncertainty may be introduced into the integrated circuit manufacturing process each time a model is used to model or make predictions about individual operations in the process.

To address these and other disadvantages of prior prediction models, the present method(s) and system(s) include a method for reducing (and/or a system configured to reduce) prediction uncertainty in a prediction model associated with a patterning process. The method comprises determining a prediction uncertainty parameter based on prediction data. The prediction data is determined using the prediction model (which has been calibrated using calibration data) associated with the patterning process. The prediction uncertainty parameter is associated with variation in the prediction data. The method comprises selecting a subset of patterning process data (e.g., measurements made on a physical wafer associated with a given pattern) based on the prediction uncertainty parameter; and recalibrating the prediction model using the calibration data and the selected subset of the patterning process data. Phrased another way, prediction data may be simulation data from the prediction model. The prediction data may be used to determine the prediction uncertainty parameter. After the evaluation of the prediction uncertainty (e.g., determination of the prediction uncertainty parameter), patterning process data with a high prediction uncertainty may be selected (e.g., based on the prediction uncertainty parameter). Prediction uncertainty may be associated with specific patterns, for example, such that patterns with high prediction uncertainty (and patterning process data associated with those patterns) may be selected for training or calibration based on the prediction uncertainty parameter. The selected patterning process data is combined with the calibration data to recalibrate the prediction model. Using the selected subset of the process data and the calibration data to recalibrate the prediction model reduces the prediction uncertainty in predictions from the prediction model. The method may be iteratively repeated, reducing the prediction uncertainty iteration by iteration until the prediction model converges, for example.

The present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "projection optics," as used herein, should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the (e.g., semiconductor) patterning device, and/or optical components for shaping, adjusting and/or projecting the radiation after the radiation passes the patterning device. The projection optics generally exclude the source and the patterning device.

The (e.g., semiconductor) patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. The design rules may include and/or specify specific parameters, limits on and/or ranges for parameters, and/or other information. One or more of the design rule limitations and/or parameters may be referred to as a "critical dimension" (CD). A critical dimension of a device can be defined as the smallest width of a line or hole or the smallest space between two lines or two holes, or other features. Thus, the CD determines the overall size and density of the designed device. One of the goals in device fabrication is to faithfully reproduce the original design intent on the substrate (via the patterning device).

The term "mask" or "patterning device" as employed in this text may be broadly interpreted as referring to a generic semiconductor patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. An example of a programmable LCD array is given in U.S. Pat. No. 5,229,872, which is incorporated herein by reference.

As used herein, the term "patterning process" generally means a process that creates an etched substrate by the application of specified patterns of light as part of a lithography process. However, "patterning process" can also include plasma etching, as many of the features described herein can provide benefits to forming printed patterns using plasma processing.

As used herein, the term "target pattern" means an idealized pattern that is to be etched on a substrate.

As used herein, the term "printed pattern" means the physical pattern on a substrate that was etched based on a target pattern. The printed pattern can include, for example, troughs, channels, depressions, edges, or other two and three dimensional features resulting from a lithography process.

As used herein, the term "prediction model" and/or "process model" (which may be used interchangeably) means a model that includes one or more models that simulate a patterning process. For example, a prediction and/or process model can include an optical model (e.g., that models a lens system/projection system used to deliver light in a lithography process and may include modelling the final optical image of light that goes onto a photoresist), a resist model (e.g., that models physical effects of the resist, such as chemical effects due to the light), and an OPC model (e.g., that can be used to make target patterns and may include sub-resolution resist features (SRAFs), etc.), and/or other models.

As used herein, the term "calibrating" means to modify (e.g., improve or tune) and/or validate something, such as the process model.

As an introduction, FIG. 1 illustrates a diagram of various subsystems of an example lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=n \sin(\Theta_{max})$, wherein n is the refractive index of the media between the substrate and the last element of the projection optics, and is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

It may be desirable to use one or more tools to produce results that, for example, can be used to design, control, monitor, etc. the patterning process. One or more tools used in computationally controlling, designing, etc. one or more aspects of the patterning process, such as the pattern design for a patterning device (including, for example, adding sub-resolution assist features or optical proximity corrections), the illumination for the patterning device, etc., may be provided. Accordingly, in a system for computationally controlling, designing, etc a manufacturing process involving patterning, the manufacturing system components and/or processes can be described by various functional modules and/or models. In some embodiments, one or more electronic (e.g., mathematical, parameterized, etc.) models may be provided that describe one or more steps and/or apparatuses of the patterning process. In some embodiments, a simulation of the patterning process can be performed using one or more electronic models to simulate how the patterning process forms a patterned substrate using a design pattern provided by a patterning device.

Figure 2:
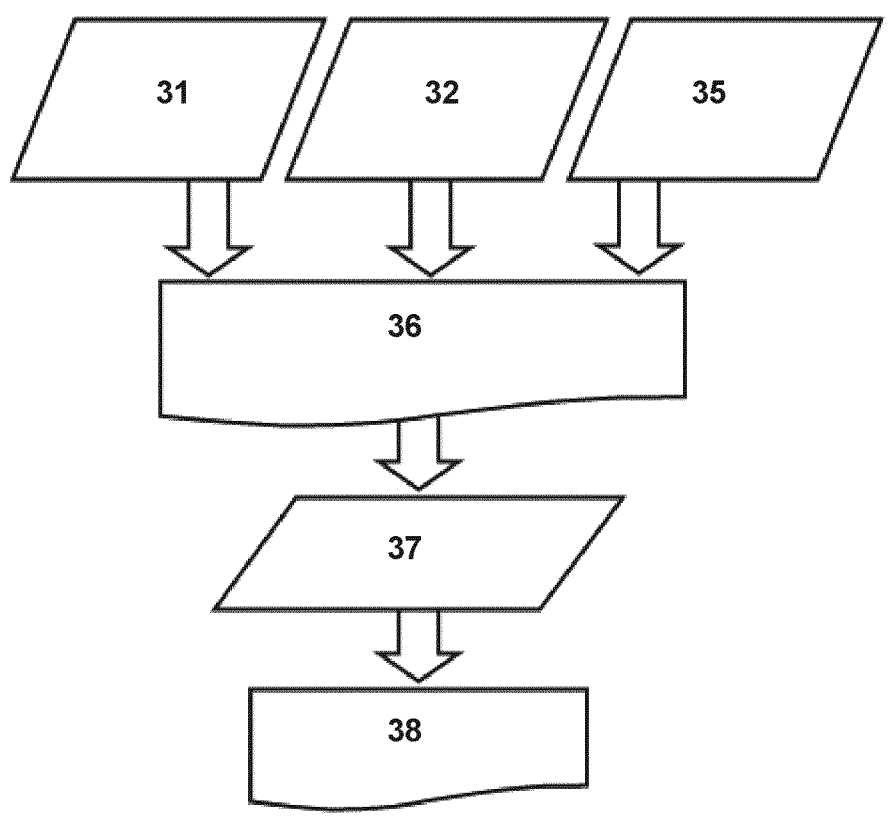
FIG. 2 illustrates an exemplary flow chart for simulating lithography in a lithographic projection apparatus, according to an embodiment.

An exemplary flow chart for simulating lithography in a lithographic projection apparatus is illustrated in FIG. 2. An illumination model 31 represents optical characteristics (including radiation intensity distribution and/or phase distribution) of the illumination. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated using the illumination model 31, the projection optics model 32, and the design layout model 35. A resist image 38 can be simulated from the aerial image 36 using a resist model 37. Simulation of lithography can, for example, predict contours and/or CDs in the resist image.

More specifically, illumination model 31 can represent the optical characteristics of the illumination that include, but are not limited to, NA-sigma ($\sigma$) settings as well as any particular illumination shape (e.g. off-axis illumination such as annular, quadrupole, dipole, etc.). The projection optics model 32 can represent the optical characteristics of the of the projection optics, including, for example, aberration, distortion, a refractive index, a physical size or dimension, etc. The design layout model 35 can also represent one or more physical properties of a physical patterning device, as described, for example, in U.S. Pat. No. 7,587,704, which is incorporated by reference in its entirety. Optical properties associated with the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics (hence design layout model 35).

The resist model 37 can be used to calculate the resist image from the aerial image, an example of which can be found in U.S. Pat. No. 8,200,468, which is hereby incorporated by reference in its entirety. The resist model is typically related to properties of the resist layer (e.g., effects of chemical processes which occur during exposure, post-exposure bake and/or development).

The objective of the simulation is to accurately predict, for example, edge placements, aerial image intensity slopes and/or CDs, which can then be compared against an intended design. The intended design is generally defined as a pre-OPC design layout which can be provided in a standardized digital file format such as GDSII, OASIS or other file format.

From the design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (e.g., circuits, cells, etc.) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips often contain one or more test patterns or gauge patterns. An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

For example, the simulation and modeling can be used to configure one or more features of the patterning device pattern (e.g., performing optical proximity correction), one or more features of the illumination (e.g., changing one or more characteristics of a spatial/angular intensity distribution of the illumination, such as change a shape), and/or one or more features of the projection optics (e.g., numerical aperture, etc.). Such configuration can be generally referred to as, respectively, mask optimization, source optimization, and projection optimization. Such optimization can be performed on their own, or combined in different combinations. One such example is source-mask optimization (SMO), which involves the configuring of one or more features of the patterning device pattern together with one or more features of the illumination. The optimization techniques may focus on one or more of the clips. The optimizations may use the machine learning model described herein to predict values of various parameters (including images, etc.).

In some embodiments, an optimization process of a system may be represented as a cost function. The optimization process may comprise finding a set of parameters (design variables, process variables, etc.) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics. The cost function can also be the maximum of these deviations (i.e., worst deviation). The term "evaluation points" should be interpreted broadly to include any characteristics of the system or fabrication method. The design and/or process variables of the system can be confined to finite ranges and/or be interdependent due to practicalities of implementations of the system and/or method. In the case of a lithographic projection apparatus, the constraints are often associated with physical properties and characteristics of the hardware such as tunable ranges, and/or patterning device manufacturability design rules. The evaluation points can include physical points on a resist image on a substrate, as well as non-physical characteristics such as dose and focus, for example.

In a lithographic projection apparatus, as an example, a cost function may be expressed as $$CF(z_1, z_2, \cdots, z_N) = \sum_{p=1}^{P} w_p f_p^2(z_1, z_2, \cdots, z_N)$$

where $(z_1, z_2, \ldots, z_N)$ are N design variables or values thereof, and $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. In some embodiments, $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in the equation above and $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In some embodiments, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. The parameters (e.g., design variables) can include any adjustable parameter such as an adjustable parameter of the source, the patterning device, the projection optics, dose, focus, etc.

The parameters (e.g., design variables) may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

In some embodiments, illumination model 31, projection optics model 32, design layout model 35, resist model 37, an SMO model, and/or other models associated with and/or included in an integrated circuit manufacturing process may be an empirical model that performs the operations of the method described herein. The empirical model may predict outputs based on correlations between various inputs (e.g., one or more characteristics of a mask or wafer image, one or more characteristics of a design layout, one or more characteristics of the patterning device, one or more characteristics of the illumination used in the lithographic process such as the wavelength, etc.).

As an example, the empirical model may be a machine learning model and/or any other parameterized model. In some embodiments, the machine learning model (for example) may be and/or include mathematical equations, algorithms, plots, charts, networks (e.g., neural networks), and/or other tools and machine learning model components. For example, the machine learning model may be and/or include one or more neural networks having an input layer, an output layer, and one or more intermediate or hidden layers. In some embodiments, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for the one or more neural networks may be freer flowing, with connections interacting in a more chaotic and complex fashion. In some embodiments, the intermediate layers of the one or more neural networks include one or more convolutional layers, one or more recurrent layers, and/or other layers.

The one or more neural networks may be trained (i.e., whose parameters are determined) using a set of training data. The training data may include a set of training samples. Each sample may be a pair comprising an input object (typically a vector, which may be called a feature vector) and a desired output value (also called the supervisory signal). A training algorithm analyzes the training data and adjusts the behavior of the neural network by adjusting the parameters (e.g., weights of one or more layers) of the neural network based on the training data. For example, given a set of N training samples of the form $\{(x_1,y_1), (x_2,y_2), \ldots, (x_N,y_N)\}$ such that $x_i$ is the feature vector of the i-th example and $y_i$ is its supervisory signal, a training algorithm seeks a neural network $g: X \rightarrow Y$, where X is the input space and Y is the output space. A feature vector is an n-dimensional vector of numerical features that represent some object (e.g., a wafer design as in the example above, a clip, etc.). The vector space associated with these vectors is often called the feature space. After training, the neural network may be used for making predictions using new samples.

In prior systems, a prediction (process) model is calibrated (e.g., trained) with calibration data. The calibration data may include images of a printed pattern (e.g., a calibration pattern and/or other patterns), simulated images of the printed pattern, and/or other information. For example, calibration may include obtaining images of a printed pattern (e.g., a printed wafer or portion thereof) that is based on a target pattern. From the images, contours (e.g., shapes, dimensions, etc.) can be extracted that correspond to features on the printed pattern. The contours can then be aligned to simulated contours, generated by the prediction (process) model, to facilitate adjustment of model parameters such that the simulated contours more accurately match the measured contours. A calibrated model may be used to make new predictions (e.g., dimensions including contours and other dimensions—prediction data) based on different target patterns. However, predictions (e.g., for the same input) from these prior systems vary, creating uncertainty about a given model.

Figure 3:
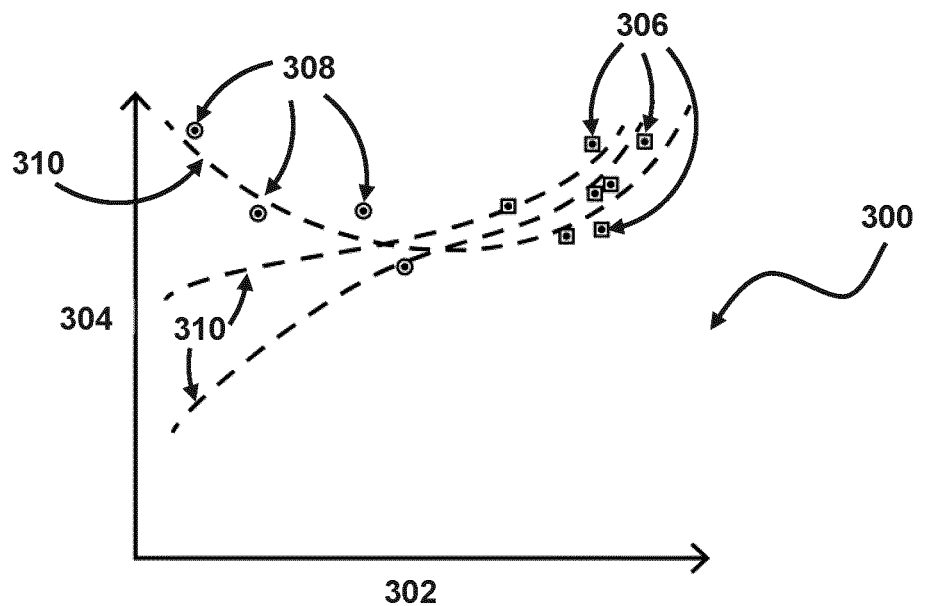
FIG. 3 illustrates plots of calibrated model input versus model output, according to an embodiment.
Figure 3:
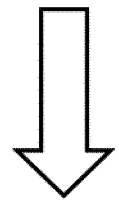
Figure 3:
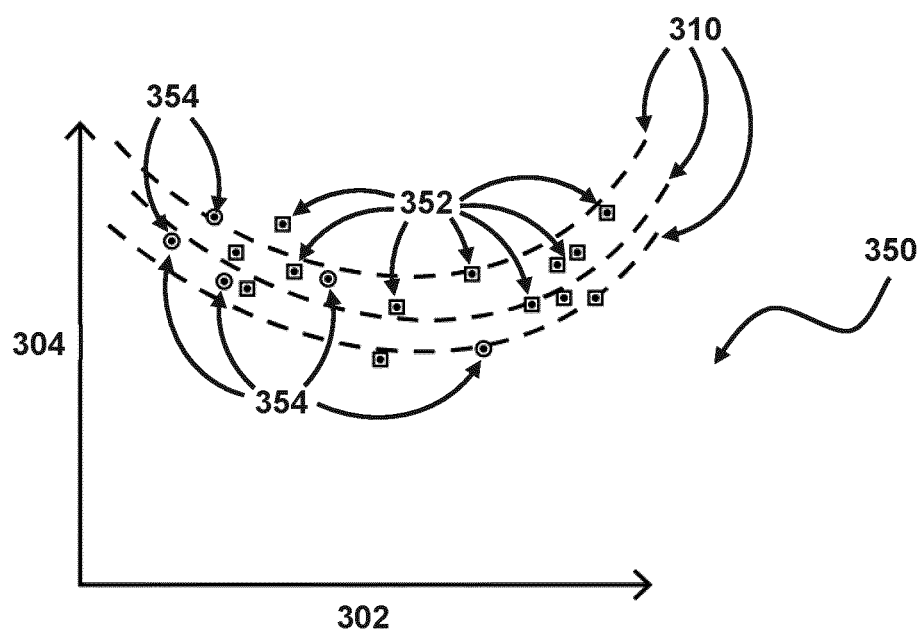

For example, FIG. 3 illustrates a first plot 300 of calibrated model input 302 (e.g., target pattern/image properties) versus model output 304 (e.g., CD, resist bias, etc.). Plot 300 illustrates (more narrowly distributed) calibration data 306 used for calibration of the model, and (more widely distributed) patterning process data 308 (e.g., a predicted pattern and/or features of, or related to, a predicted pattern) used to verify the calibrated model. As shown in plot 300, the calibrated models can fit the calibration data 306 well but demonstrate inconsistent prediction results for process data 308. This tends to cause prediction in uncertainty in a selected particular model. For example, multiple candidate models 310 (e.g., adjusted versions of the prediction model used to generate prediction data) may fit patterning process data 308 (and calibration data 306) differently. The candidate models may be configured as different from each other in any suitable manner without departing from the scope of the present disclosure.

In contrast to prior modeling methods, the present method comprises determining a prediction uncertainty parameter based on prediction data, selecting a subset of patterning process data (e.g., measurements made on a physical substrate (e.g. a layer of a wafer or other substrates) associated with a given pattern) based on the prediction uncertainty parameter, and recalibrating the prediction model using the selected subset of patterning process data and/or previously used calibration data as described herein. This reduces uncertainty in predictions from the prediction model. In some embodiments, the prediction uncertainty parameter indicates uncertainty of making a prediction for a certain pattern by using multiple models. As shown in plot 350 of FIG. 3, calibration data 352 used for calibration of the model, and prediction data 354 (e.g., a pattern, etc.) predicted by the calibrated model are more narrowly distributed (e.g., the data even overlaps in this example). The multiple candidate models 310 (e.g., the adjusted versions of the prediction model used to generate prediction data 308) now fit prediction data 354 (and calibration data 352) similarly.

Figure 4:
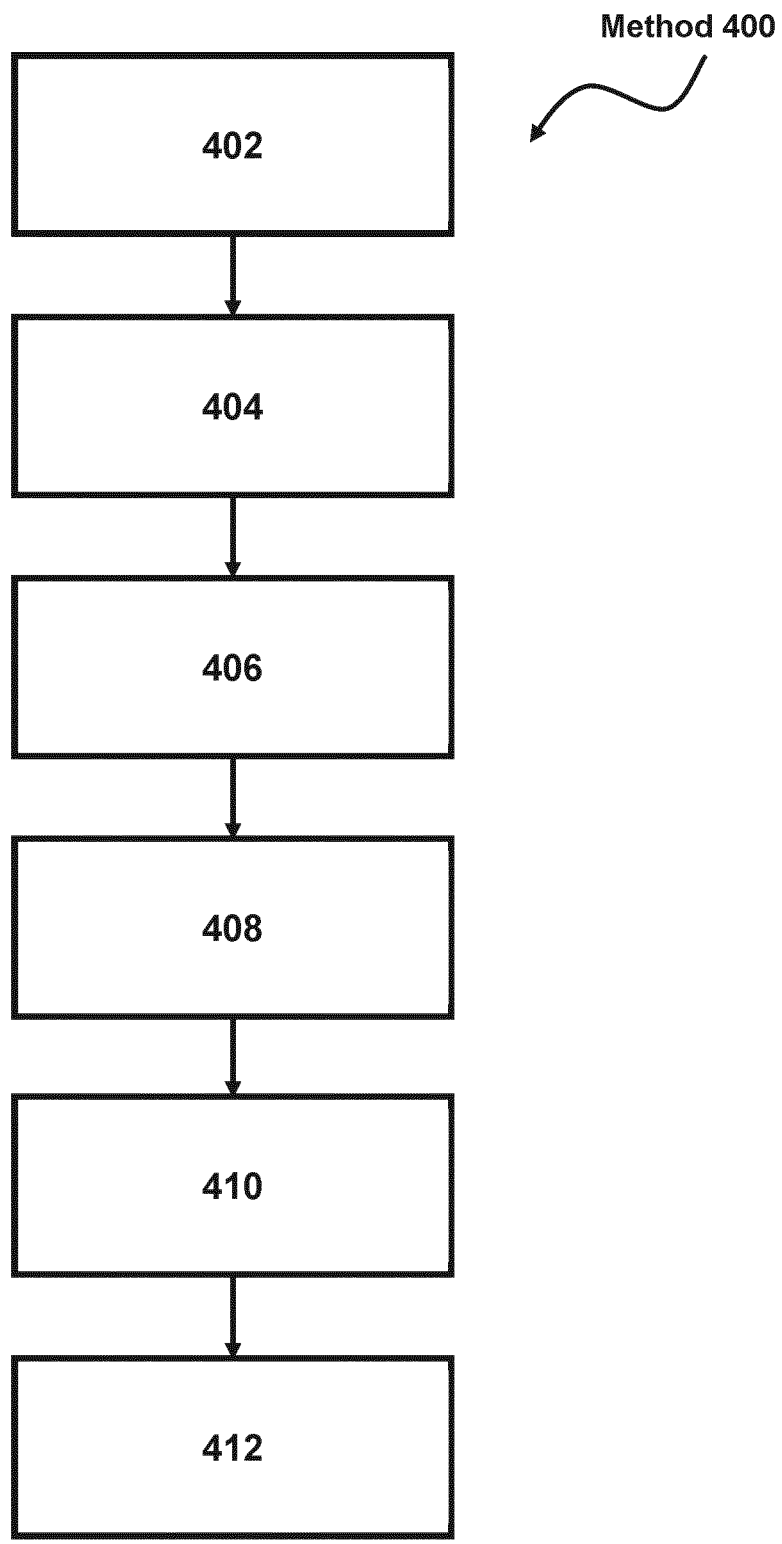
FIG. 4 illustrates the present method, according to an embodiment.

FIG. 4 illustrates present method 400. In some embodiments, method 400 comprises determining 402 prediction data using a prediction model, determining 404 a prediction uncertainty parameter, selecting 406 a subset of patterning process data based on the prediction uncertainty parameter, and recalibrating 408 the prediction model. In some embodiments, method 400 includes determining 410 device manufacturing process parameters, determining 412 an adjustment for a semiconductor device manufacturing process and/or apparatus, and/or other operations. The operations of method 400 presented below are intended to be illustrative. In some embodiments, method 400 may be accomplished with one or more additional operations not described, and/or without one or more of the operations discussed. For example, operations 410, 412, and/or other operations may be optional. Additionally, the order in which the operations of method 400 are illustrated in FIG. 4 and described below is not intended to be limiting. For example, method 400 may or may not include operations 410 and/or 412.

As described above, at an operation 402, prediction data is determined using a prediction model. The prediction data is determined using a prediction model (which has been calibrated using calibration data) associated with the patterning process and/or any other portion of a semiconductor device manufacturing process. For example, the prediction model may be associated with etching, deposition, OPC, overlay, alignment, a resist layer, an aerial image, illumination, optics, a design layout, hotspot detection, process window qualification, process control, and/or other aspects of the semiconductor device manufacturing process. In some embodiments, the prediction model is a machine learning model, and calibrating the prediction model comprises training the machine learning model.

The prediction model may be (e.g., previously) calibrated using calibration data. The calibration data may comprise and/or be related to a calibration pattern associated with geometrical features of a pattern on a substrate (e.g. a layer of a wafer or other substrates) and/or other data. For example, the calibration data may include contours (e.g., shapes, dimensions, etc.), biases, signal strengths, and/or other information determined based on simulations of a patterning process with a target pattern, the target pattern itself, and/or images of the target pattern produced in a substrate (e.g., a physical wafer and/or other substrates).

The prediction data may comprise and/or be related to a prediction pattern associated with predicted geometrical features of a pattern on the substrate (e.g. a layer of a wafer—based on a different target pattern) and/or other data. For example, the prediction data may comprise predicted pattern parameter values. These pattern parameter values may include dimensions of geometrical features (e.g., contour shapes and/or dimensions, lengths, widths, heights, distances, locations, etc.), biases, a critical dimension, alignment parameters, overlay parameters, an intensity used in the patterning process, an image slope associated with a pattern of the patterning process, and/or other parameters. The prediction data may be generated by the calibrated prediction model based on input to the calibrated prediction model. The input may comprise features of a new target pattern, images of such a patterns, and/or other input.

At an operation 404, a prediction uncertainty parameter is determined. The prediction uncertainty parameter is associated with variation in the prediction data and/or the pattern parameter values, e.g., among multiple models. In some embodiments, the prediction uncertainty parameter is associated with variation in: a value of a dimension of a geometrical feature (e.g., contour shapes and/or dimensions, lengths, widths, heights, distances, locations, etc.), biases, a critical dimension, a CD gauge, an EP gauge, an overlay signal, an alignment signal, an intensity used in the patterning process, an image slope associated with a pattern of the patterning process, and/or other aspects of the patterning process.

In some embodiments, the prediction uncertainty parameter is determined based on the variation in the predicted pattern parameter values (and/or the prediction data) and fitting requirements associated with the prediction model. By way of a non-limiting example, the prediction data may comprise predicted critical dimension values. The prediction uncertainty parameter may comprise critical dimension variation (CDV). The critical dimension variation may be determined based on variation in the predicted critical dimension values and fitting requirements associated with the prediction model. However, advantageously, the present method is configured to provide a standardized workflow that can handle various different prediction uncertainty parameters. In some embodiments, for example, the present method is configured to standardize or unify a work flow that can handle CD gauge measurements and EP gauge measurements (e.g., and/or a conversion of CD gauge measurements to EP gauge measurements to produce an even more accurate model).

Continuing with the CDV example, critical dimension variation may be determined based on the equation CDV=Simulation Variance (M1, M2, . . . MN)/Spec, where M1, M2, . . . MN define candidate models (e.g., that fit the calibration data and the prediction data) and Spec represents fitting requirements associated with the prediction model. The simulation variance may be representative of the distribution (and/or other statistical properties) of different prediction data points (e.g., 308 shown in FIG. 3). The candidate models may be adjusted and/or different versions of the prediction model that fit the calibration data and the prediction data. For example, the candidate models may be the prediction model, but with different adjusted model parameters that cause a given candidate model (e.g., with a given set of adjusted model parameters) to fit the prediction data (and the calibration data). In some embodiments, a candidate model may be a different model altogether. In some embodiments, the fitting requirements comprise critical dimension error, edge placement error, contour shape fidelity, and/or other fitting requirements. Fitting requirements may generally refer to metrics used to measure model performance related to critical dimension, edge placement, and/or contour shape (by way of three non-limiting examples). Fitting requirements define the differences between prediction and physical wafer measurement data, and may also include and/or be associated with numerical values associated with geometrical features, a pattern, and/or a process.

The example above is not intended to be limiting. Other prediction uncertainty parameters are contemplated. For example, prediction uncertainty parameters related to geometrical features (e.g., contour shapes and/or dimensions, lengths, widths, heights, distances, locations, etc.), biases, overlay and/or alignment signals, an image slope associated with a pattern of the patterning process, an intensity used in the patterning process, and/or other prediction uncertainty parameters are contemplated.

In some embodiments, the prediction uncertainty parameter may be a singular value (e.g., a CDV). In some embodiments, the prediction uncertainty parameter may be a range of values (e.g., an acceptable range of predicted dimensions and/or other ranges). In some embodiments, the prediction uncertainty parameter comprises a ranking of individual process data points (e.g., with process data points in closer plotted proximity to calibration data being ranked higher, and/or other rankings). In some embodiments, the prediction uncertainty parameter comprises a maximum number of individual process data points (e.g., process data points cease being selected after a target number of data points are selected, a randomly selected target number of data points, a most recent target number of data points, a maximum number of data points within a certain value range, etc.).

At an operation 406, a subset of process data is selected. The subset of process data is selected based on the prediction uncertainty parameter. As described above, prediction data is simulation data (e.g., a prediction pattern, etc.) from the prediction model. The prediction data is used to determine the prediction uncertainty parameter. Prediction uncertainty may be associated with specific patterns, for example, such that patterns with high prediction uncertainty (and process data associated with those patterns) may be selected based on the prediction uncertainty parameter. In some embodiments, selecting the subset of the process data based on the prediction uncertainty parameter may comprise selecting process data points of a singular value specified by the prediction uncertainty parameter, selecting a range of process data points associated with the prediction uncertainty parameter, selecting process data points based on a ranking assigned to the individual process data points using the prediction uncertainty parameter, selecting (e.g., randomly or not randomly) a maximum number of individual process data points specified by the prediction uncertainty parameter, and/or other selection. For example, continuing with the CDV described above, the subset of process data may be selected by sorting the process data points based on the CDV value (e.g., in a descending mode), and cutting off an allowable number as the subset.

Figure 5:
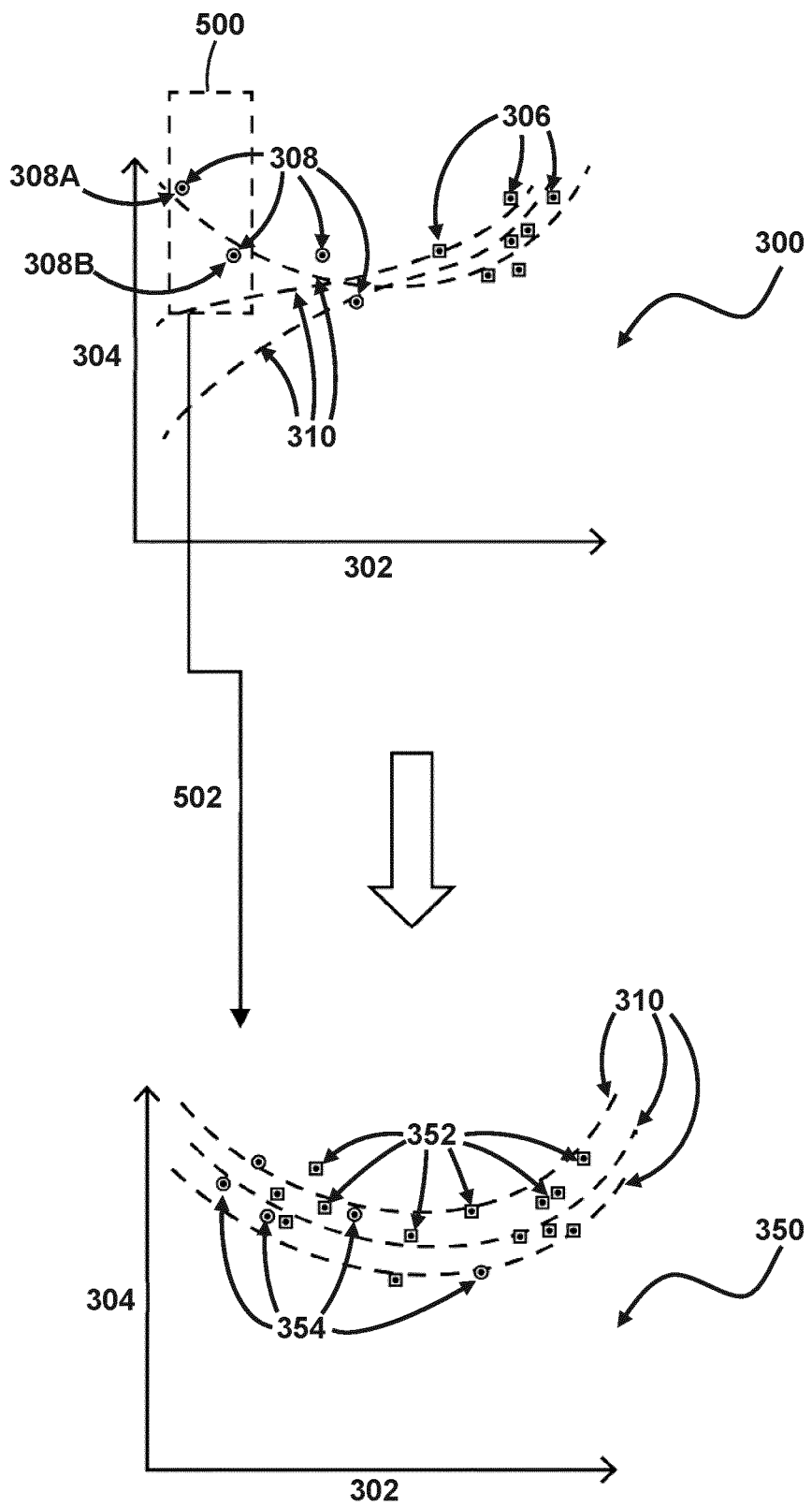
FIG. 5 illustrates selecting a subset of prediction data, according to an embodiment.

FIG. 5 illustrates selecting a subset of process data. For example, FIG. 5 illustrates first plot 300 (also shown in FIG. 3) of calibrated model input 302 versus model output 304. Plot 300 illustrates (more narrowly distributed) calibration data 306 used for calibration of the model, and (more widely distributed) prediction data 308 (e.g., a predicted pattern and/or features of, or related to, a predicted pattern) predicted by the calibrated model. As shown in plot 300, the relatively (e.g., compared to calibration data 306) widely distributed prediction data 308 causes uncertainty about the calibrated model used to generate prediction data 308. For example, multiple candidate models 310 (e.g., adjusted versions of the prediction model used to generate prediction data 308) may fit prediction data 308 (and calibration data 306). The present method comprises determining a prediction uncertainty parameter based on prediction data (as described above), selecting 500 a subset 308A and 308B of patterning process data associated with prediction data 308 (e.g., a pattern) that has high uncertainty—determined based on the prediction uncertainty parameter, and recalibrating 502 the prediction model using the selected 500 subset 308A and 308B of process data (along with calibration data as described herein). This reduces uncertainty in predictions from the prediction model. As shown in plot 350 of FIG. 5, calibration data 352 used for calibration of the model, and prediction data 354 predicted by the calibrated model are more narrowly distributed (e.g., the data even overlaps in this example). The multiple candidate models 310 (e.g., the adjusted versions of the prediction model used to generate prediction data 308) now fit prediction data 354 (and calibration data 352) similarly.

Figure 6:
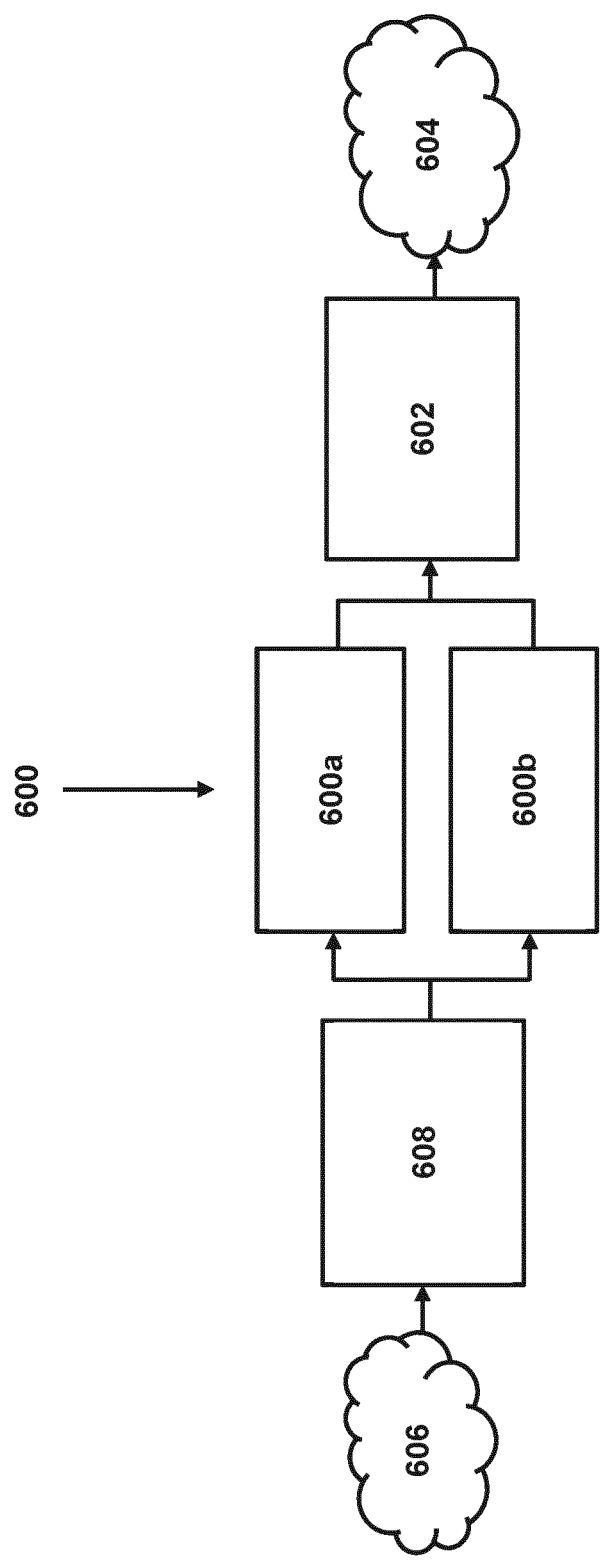
FIG. 6 illustrates an example of determining a prediction uncertainty parameter, and selecting a subset of prediction data (e.g., for use in recalibration) based on the determined prediction uncertainty parameter, according to an embodiment.

FIG. 6 illustrates an example of determining 600 a prediction uncertainty parameter, and selecting 602 a subset 604 of process data associated with prediction data 608 having high uncertainty (e.g., for use in recalibration) based on the determined prediction uncertainty parameter for a given prediction model. As shown in FIG. 6, calibration data 606 is used to calibrate a prediction model and generate prediction data 608 (e.g., such that multiple candidate models—adjusted versions of the prediction model used to generate prediction data 608 may fit prediction data 608 and calibration data 606). As described above, many different prediction uncertainty parameters may be determined 600. FIG. 6 illustrates two different options 600a and 600b, for example (but the illustration of only two options should not be considered limiting). Option 600a may, for example, be CDV (e.g., as described above). As another example, option 600b may be, or be related to a difference between a signal from one candidate model and another candidate model on a specified pattern (e.g., using a GDS layout). Many other examples exist. Once a prediction uncertainty parameter is determined (e.g., either 600a or 600b), the prediction uncertainty parameter is used to select 602 the subset 604 of prediction data 608.

Returning to FIG. 4, at an operation 408, the prediction model is recalibrated. The prediction model is recalibrated using the calibration data and the selected subset of the process data, and/or other information. Recalibrating the prediction model using the calibration data and the selected subset of the process data comprises providing both the calibration data and the selected subset of the process data as input to the prediction model and/or other operations. During recalibration, contours of a target design imparted to a layer of a wafer can be aligned to simulated contours generated by the prediction model (e.g., described by the selected subset of process data points), to facilitate adjustment of model parameters such that the simulated contours more accurately match the measured contours. Recalibrating the prediction model using the calibration data and the selected subset of the process data reduces the prediction uncertainty in predictions from the prediction model (e.g., the different candidate models shown in FIGS. 3 and/or 5 agree more and more in their predictions).

Figure 7:
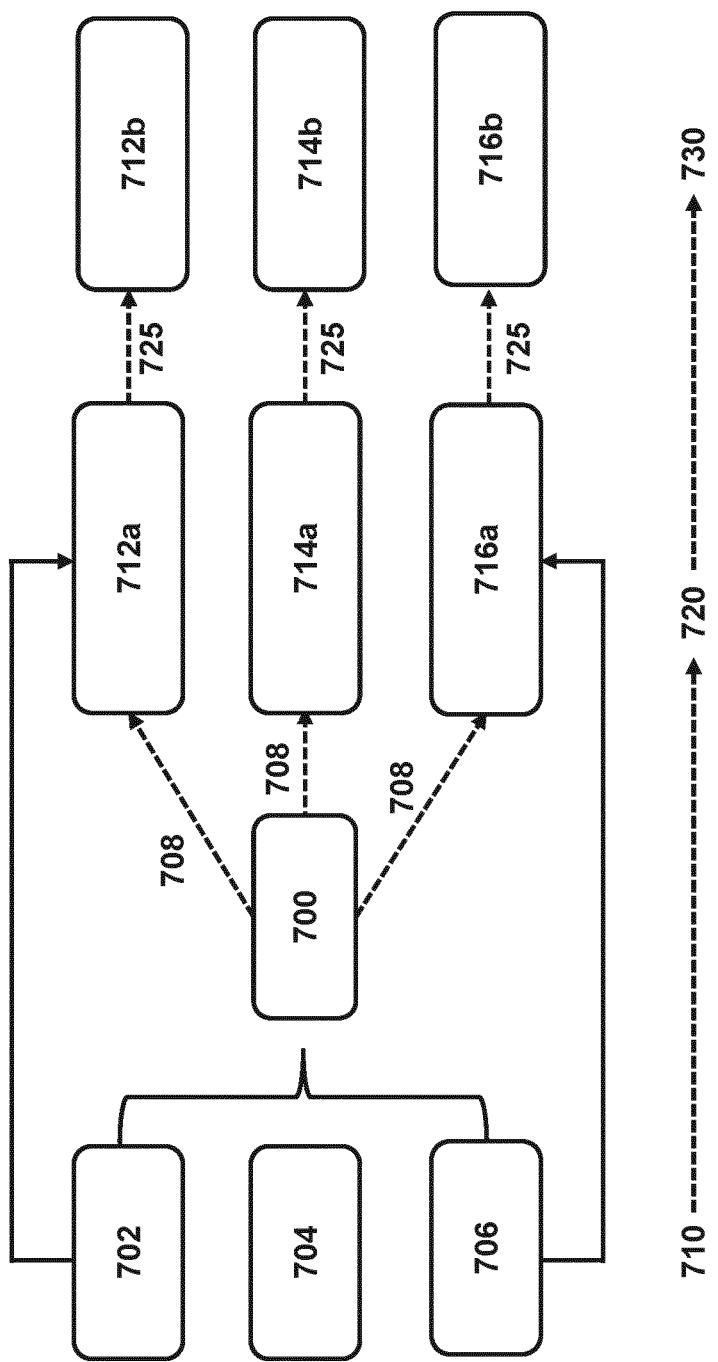
FIG. 7 illustrates selecting a subset of prediction data generated by a set of candidate prediction models (e.g., variations of a prediction model that fit prediction data and calibration data), and providing the selected subset of prediction data to the candidate prediction models to recalibrate (or retrain) the prediction models, according to an embodiment.
Figure 8:
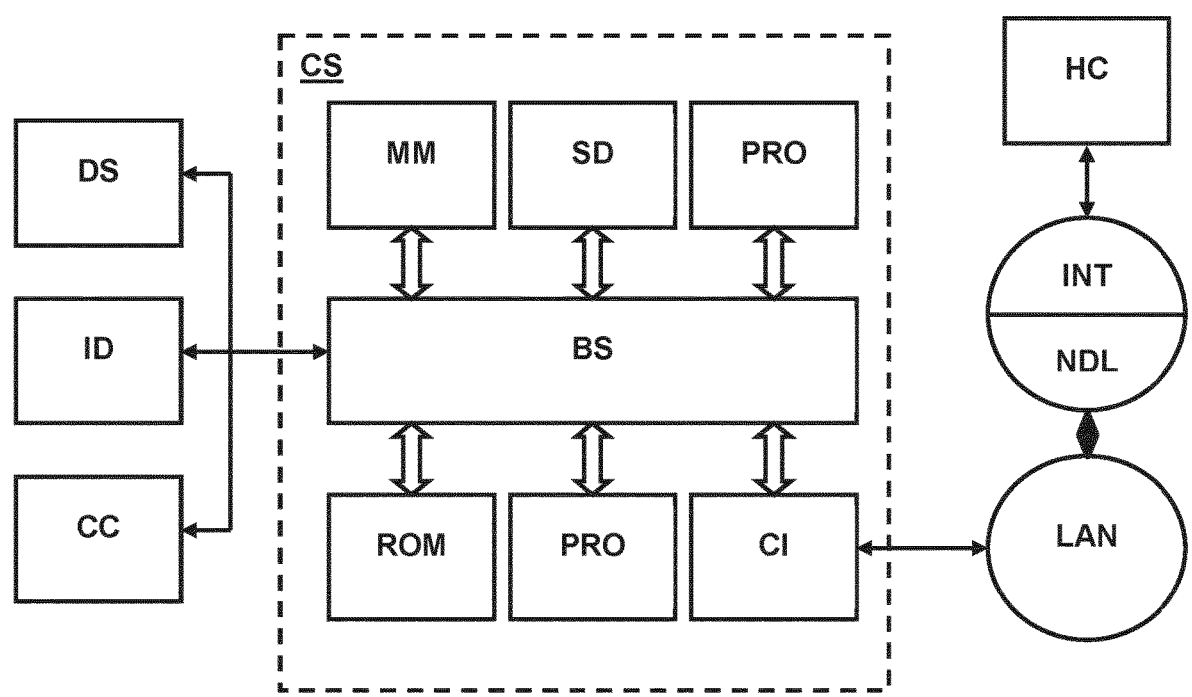
FIG. 8 is a block diagram of an example computer system, according to an embodiment.

FIG. 7 illustrates selecting a subset of process data 700. The subset of process data 700 is selected based on a prediction uncertainty parameter determined based on prediction data generated by a set of candidate prediction models 702, 704, 706 (e.g., variations of a prediction model that fit prediction data and calibration data as described above), and providing 708 the selected subset of process data 700 to the candidate prediction models to recalibrate (or retrain) the prediction models. When the candidate prediction models are provided with the selected subset of process data and recalibrated, an uncertainty about predictions from the candidate models (e.g., the various possible versions of the prediction model) is decreased. The candidate prediction models 702, 704, 706 may be thought of as reference models and/or 1 k gauges 710, for example. Models 702, 704, and 706 may be Focus Exposure Model (FEM) and/or other models, for example. Candidate models 712a, 714a, and 716a that have received the selected subset of process data 700 may be machine learning models and/or 3 k gauges 720, for example. The recalibrated 725 versions of the individual models may be updated (or incrementally retrained) Machine learning models and/or 4 k gauges 730, for example. In some embodiments, a same set of patterns may be fed to the candidate models to generate prediction data. A prediction uncertainty parameter indicates the variance of the among the multiple candidate models. The patterns that causes the highest uncertainty among the candidate models may be selected for the next iteration of calibration or training.

Returning to FIG. 4, in some embodiments, operations 402-408 (and/or other operations) may be iteratively repeated, reducing the prediction uncertainty iteration by iteration until the prediction model converges, for example. In some embodiments, model convergence comprises a model error breaching a model error threshold level. The model error may be a difference between a reference geometry (e.g., contour) and a simulated geometry generated from a simulation of the patterning process by the prediction model. For example, the reference geometry may be a measured geometry from a scanning electron microscope.

As described above, in some embodiments, method 400 includes determining 410 device manufacturing process parameters, determining 412 an adjustment for a semiconductor device manufacturing process and/or apparatus, and/or other operations. The one or more semiconductor device manufacturing process parameters may be determined based on predictions from the recalibrated prediction model, for example, and/or other information. The adjustment for the semiconductor device manufacturing apparatus may be determined based on the one or more determined semiconductor device manufacturing parameters and/or other information. In some embodiments, method 400 includes making the adjustment to the apparatus.

In some embodiments, the one or more determined semiconductor device manufacturing process parameters comprise one or more of a mask design, a pupil shape, a dose, a focus, etching parameters, deposition parameters, chemical mechanical polishing parameters, and/or other semiconductor device manufacturing process parameters. In some embodiments (e.g., as described above), the method comprises determining an adjustment for a semiconductor device manufacturing process and/or apparatus based on the one or more determined semiconductor device manufacturing parameters. In some embodiments, the method comprises adjusting the wafer manufacturing apparatus based on the determined adjustment.

As an example, if the determined process parameter was a (e.g., new) pupil shape, a dose, or a focus, the manufacturing apparatus could be adjusted from an old or previous pupil shape, dose, or focus, to the determined (e.g., new) pupil shape, dose, or focus. Similarly, if a model prediction has to do with a mask design, and the determined manufacturing process parameter is a new or adjusted mask design, the semiconductor manufacturing apparatus could be adjusted based on this new design (e.g., one might adjust an intensity, an alignment, or even a pupil shape, dose, or focus based on new mask shapes, sizes, etc.)

In some embodiments, e.g., where the one or more determined semiconductor device manufacturing process parameters comprise the mask design, the method may comprise adjusting the mask design from a first mask design to a second mask design based on the predictions from the recalibrated prediction model.

Figure 10:
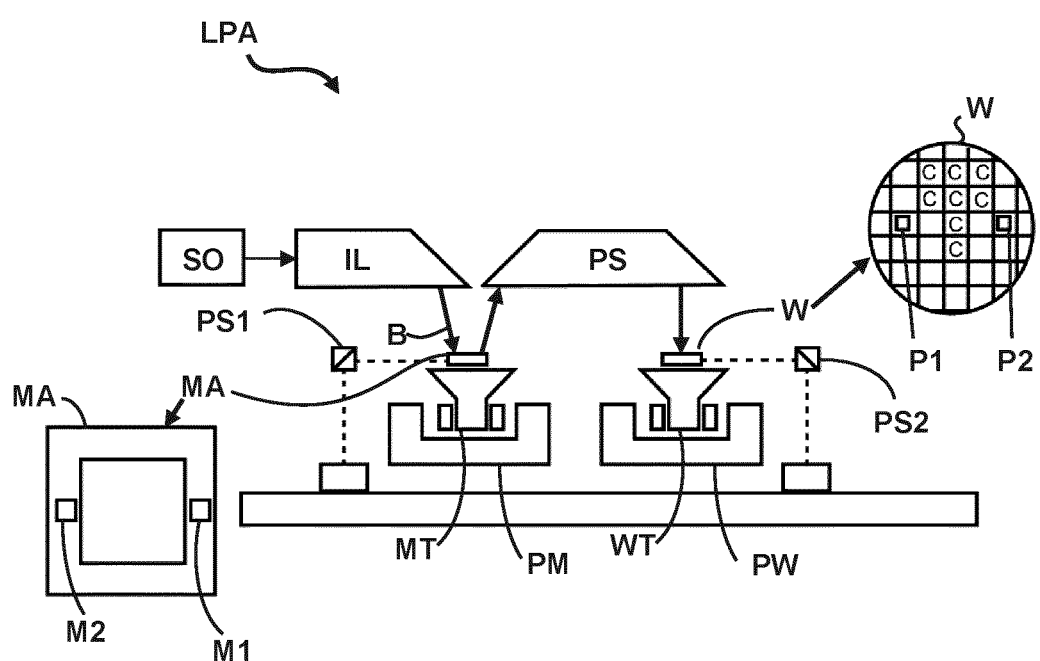
FIG. 10 is a schematic diagram of another lithographic projection apparatus, according to an embodiment.

FIG. 10 is a diagram of an example computer system CS that may be used for one or more of the operations described herein. Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) may use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 9:
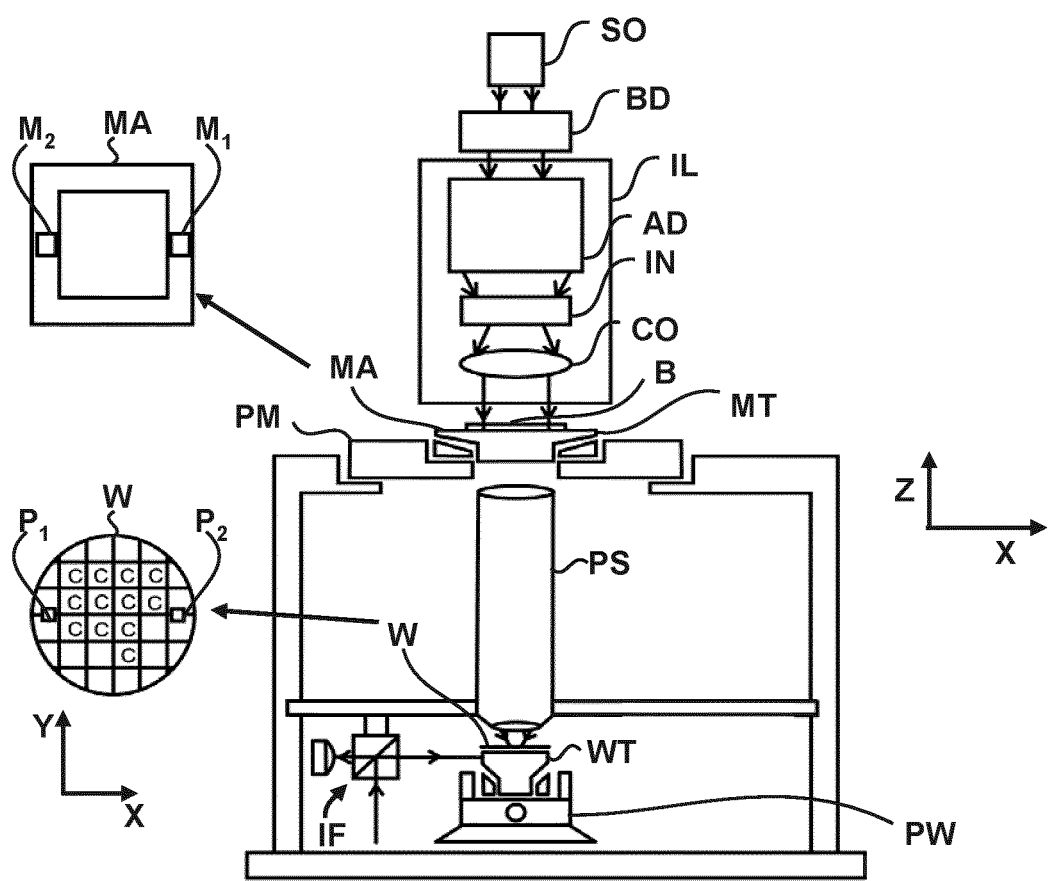
FIG. 9 is a schematic diagram of a lithographic projection apparatus, according to an embodiment.

FIG. 9 is a schematic diagram of a lithographic projection apparatus, according to an embodiment. The lithographic projection apparatus can include an illumination system IL, a first object table MT, a second object table WT, and a projection system PS. Illumination system IL, can condition a beam B of radiation. In this example, the illumination system also comprises a radiation source SO. First object table (e.g., a patterning device table) MT can be provided with a patterning device holder to hold a patterning device MA (e.g., a reticle), and connected to a first positioner to accurately position the patterning device with respect to item PS. Second object table (e.g., a substrate table) WT can be provided with a substrate holder to hold a substrate W (e.g., a resist-coated silicon wafer), and connected to a second positioner to accurately position the substrate with respect to item PS. Projection system (e.g., which includes a lens) PS (e.g., a refractive, catoptric or catadioptric optical system) can image an irradiated portion of the patterning device MA onto a target portion C (e.g., comprising one or more dies) of the substrate W.

As depicted, the apparatus can be of a transmissive type (i.e., has a transmissive patterning device). However, in general, it may also be of a reflective type, for example (with a reflective patterning device). The apparatus may employ a different kind of patterning device for a classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander, for example.

The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus. The radiation beam that it produces may be led into the apparatus (e.g., with the aid of suitable directing mirrors), for example. This latter scenario can be the case when source SO is an excimer laser (e.g., based on KrF, ArF or F2 lasing), for example.

The beam B can subsequently intercept patterning device MA, which is held on a patterning device table MT. Having traversed patterning device MA, the beam B can pass through the lens PL, which focuses beam B onto target portion C of substrate W. With the aid of the second positioning means (and interferometric measuring means IF), the substrate table WT can be moved accurately, e.g. to position different target portions C in the path of beam B. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool), patterning device table MT may be connected to a short stroke actuator, or may be fixed.

The depicted tool can be used in two different modes, step mode and scan mode. In step mode, patterning device table MT is kept essentially stationary, and an entire patterning device image is projected in one operation (i.e., a single "flash") onto a target portion C. Substrate table WT can be shifted in the x and/or y directions so that a different target portion C can be irradiated by beam B. In scan mode, essentially the same scenario applies, except that a given target portion C is not exposed in a single "flash." Instead, patterning device table MT is movable in a given direction (e.g., the "scan direction", or the "y" direction) with a speed v, so that projection beam B is caused to scan over a patterning device image. Concurrently, substrate table WT is simultaneously moved in the same or opposite direction at a speed V=Mv, in which M is the magnification of the lens (typically, M=¼ or ⅕). In this manner, a relatively large target portion C can be exposed, without having to compromise on resolution.

FIG. 10 is a schematic diagram of another lithographic projection apparatus (LPA). LPA can include source collector module SO, illumination system (illuminator) IL configured to condition a radiation beam B (e.g. EUV radiation), support structure MT, substrate table WT, and projection system PS. Support structure (e.g. a patterning device table) MT can be constructed to support a patterning device (e.g. a mask or a reticle) MA and connected to a first positioner PM configured to accurately position the patterning device. Substrate table (e.g. a wafer table) WT can be constructed to hold a substrate (e.g. a resist coated wafer) W and connected to a second positioner PW configured to accurately position the substrate. Projection system (e.g. a reflective projection system) PS can be configured to project a pattern imparted to the radiation beam B by patterning device MA onto a target portion C (e.g. comprising one or more dies) of the substrate W.

As shown in this example, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP"), the plasma can be produced by irradiating a fuel, such as a droplet, stream or cluster of material having the line-emitting element, with a laser beam. Source collector module SO may be part of an EUV radiation system including a laser (not shown in FIG. 10), for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation. In this example, the laser may not be considered to form part of the lithographic apparatus and the radiation beam can be passed from the laser to the source collector module with the aid of a beam delivery system comprising, for example, suitable directing mirrors and/or a beam expander. In other examples, the source may be an integral part of the source collector module, for example when the source is a discharge produced plasma EUV generator, often termed a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder, or capacitive sensor), the substrate table WT can be moved accurately (e.g. to position different target portions C in the path of radiation beam B). Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode. In step mode, the support structure (e.g. patterning device table) MT and the substrate table WT are kept essentially stationary, while an entire pattern imparted to the radiation beam is projected onto a target portion C at one time (e.g., a single static exposure). The substrate table WT is then shifted in the X and/or Y direction so that a different target portion C can be exposed. In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de)magnification and image reversal characteristics of the projection system PS. In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
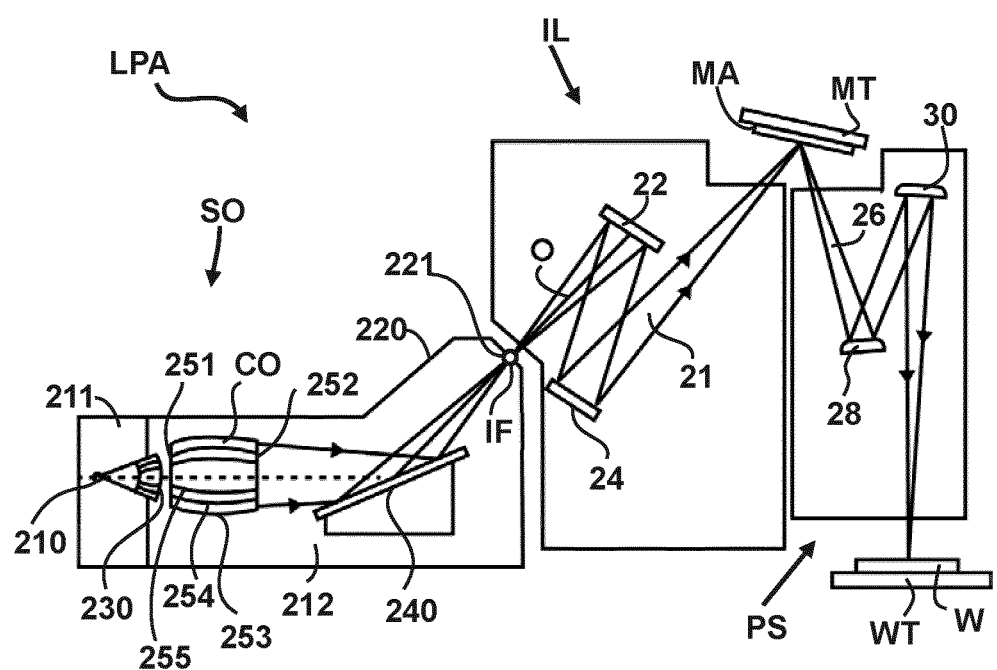
FIG. 11 is a detailed view of a lithographic projection apparatus, according to an embodiment.

FIG. 11 is a detailed view of the lithographic projection apparatus shown in FIG. 10. As shown in FIG. 11, the LPA can include the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 (described below) also includes a channel structure. The collector chamber 211 may include a radiation collector CO which may be a grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT. More elements than shown may generally be present in illumination optics unit IL and projection system PS. The grating spectral filter 240 may optionally be present, depending upon the type of lithographic apparatus, for example. Further, there may be more mirrors present than those shown in the figures, for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 12:
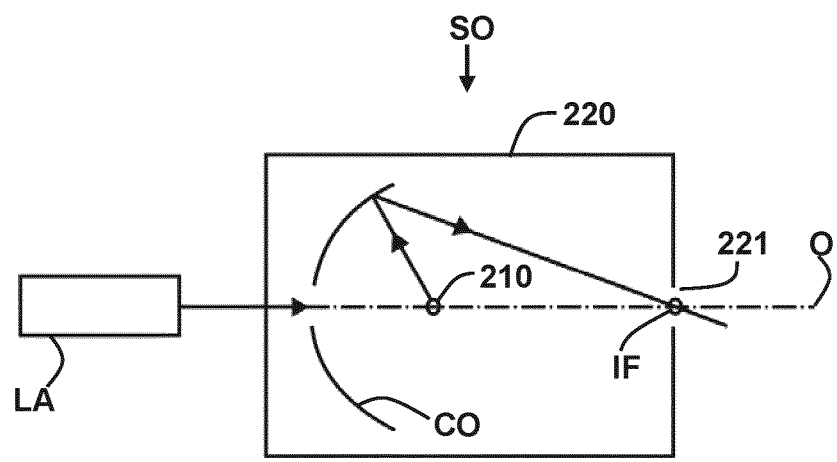
FIG. 12 is a detailed view of the source collector module of the lithographic projection apparatus, according to an embodiment.

FIG. 12 is a detailed view of source collector module SO of the lithographic projection apparatus LPA (shown in previous figures). Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

Figure 13:
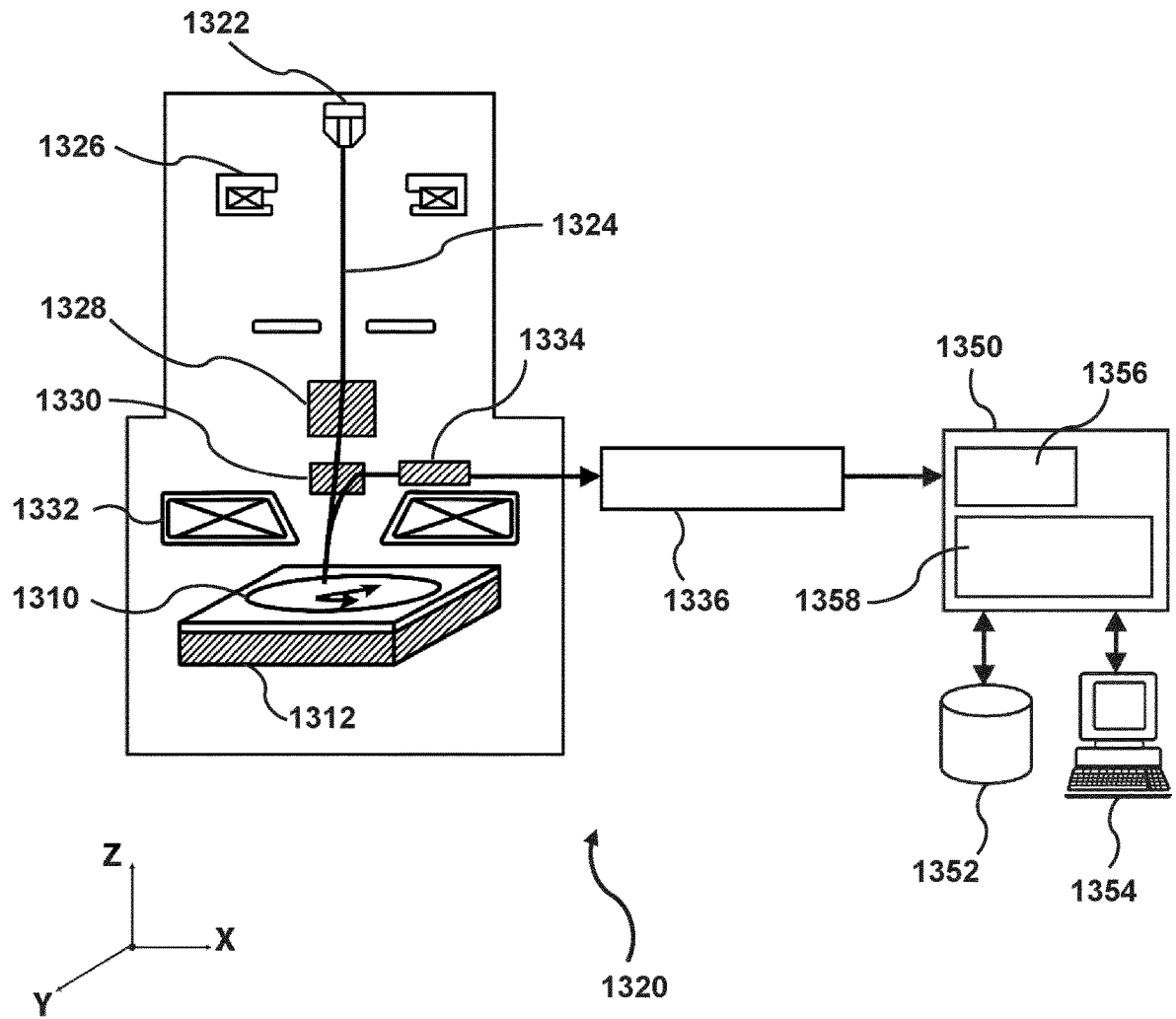
FIG. 13 schematically depicts an embodiment of an electron beam inspection apparatus, according to an embodiment.

FIG. 13 schematically depicts an embodiment of an electron beam inspection apparatus 1320. In some embodiments, the inspection apparatus may be an electron beam inspection apparatus (e.g., the same as or similar to a scanning electron microscope (SEM)) that yields an image of a structure (e.g., some or all the structure of a device, such as an integrated circuit) exposed or transferred on the substrate. A primary electron beam 1324 emitted from an electron source 1322 is converged by condenser lens 1326 and then passes through a beam deflector 1328, an E×B deflector 1330, and an objective lens 1332 to irradiate a substrate 1310 on a substrate table 1312 at a focus.

When the substrate 1310 is irradiated with electron beam 1324, secondary electrons are generated from the substrate 1310. The secondary electrons are deflected by the E×B deflector 1330 and detected by a secondary electron detector 1334. A two-dimensional electron beam image can be obtained by detecting the electrons generated from the sample in synchronization with, e.g., two dimensional scanning of the electron beam by beam deflector 1328 or with repetitive scanning of electron beam 1324 by beam deflector 1328 in an X or Y direction, together with continuous movement of the substrate 1310 by the substrate table 1312 in the other of the X or Y direction. Thus, in an embodiment, the electron beam inspection apparatus has a field of view for the electron beam defined by the angular range into which the electron beam can be provided by the electron beam inspection apparatus (e.g., the angular range through which the deflector 1328 can provide the electron beam 1324). Thus, the spatial extent of the field of the view is the spatial extent to which the angular range of the electron beam can impinge on a surface (wherein the surface can be stationary or can move with respect to the field).

As shown in FIG. 13, a signal detected by secondary electron detector 1334 may be converted to a digital signal by an analog/digital (A/D) converter 1336, and the digital signal may be sent to an image processing system 1350. In an embodiment, the image processing system 1350 may have memory 1356 to store all or part of digital images for processing by a processing unit 1358. The processing unit 1358 (e.g., specially designed hardware or a combination of hardware and software or a computer readable medium comprising software) is configured to convert or process the digital images into datasets representative of the digital images. In an embodiment, the processing unit 1358 is configured or programmed to cause execution of an operation (e.g., SEM inspection) described herein. Further, image processing system 1350 may have a storage medium 1352 configured to store the digital images and corresponding datasets in a reference database. A display device 1354 may be connected with the image processing system 1350, so that an operator can conduct necessary operation of the equipment with the help of a graphical user interface.

Figure 14:
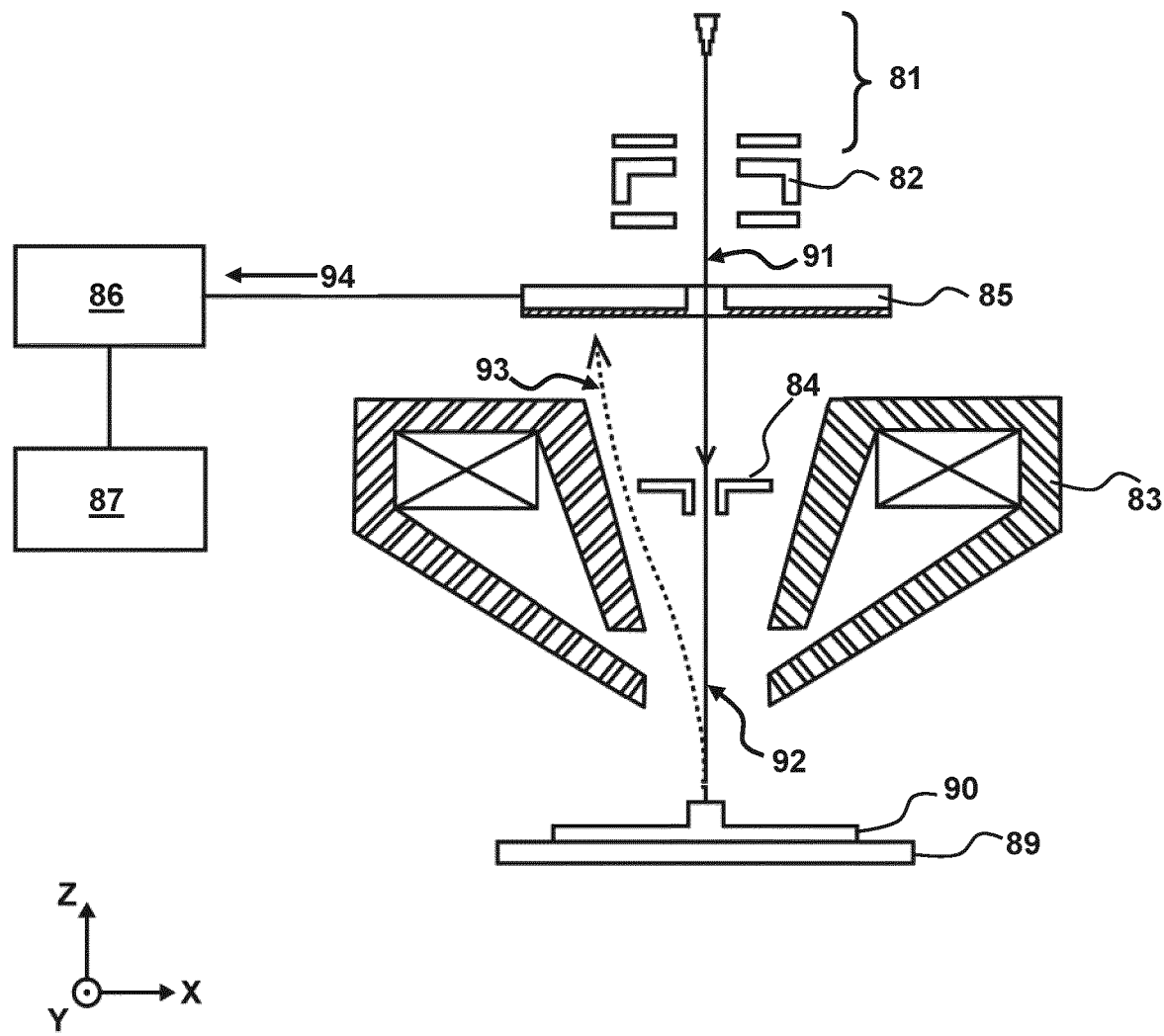
FIG. 14 schematically illustrates another embodiment of an inspection apparatus, according to an embodiment.

FIG. 14 schematically illustrates another embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, an image forming module 86, and/or other components. The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In some embodiments, the charged particle beam generator 81, the condenser lens module 82, and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly form at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. In some embodiments, the monitoring module 87 is configured or programmed to cause execution of an operation described herein. In some embodiments, the monitoring module 87 comprises a computing device. In some embodiments, the monitoring module 87 comprises a computer program configured to provide functionality described herein. In some embodiments, a probe spot size of the electron beam in the system of FIG. 14 is significantly larger compared to, e.g., a CD, such that the probe spot is large enough so that the inspection speed can be fast. However, the resolution may be lower because of the large probe spot.

SEM images, from, e.g., the system of FIG. 13 and/or FIG. 14, may be processed to extract dimensions, shapes, contours, and/or other information that describe the edges of objects, representing semiconductor device structures, in the image. The shapes, contours, and/or other information may be quantified via metrics, such as CD, at user-defined cut-lines and/or in other locations. In some embodiments, the images of device structures are compared and quantified via metrics, such as an edge-to-edge distance (CD) measured on extracted contours or simple pixel differences between images. Alternatively, metrics can include EP gauges and/or other parameters.

Embodiments of the present disclosure can be further described by the following clauses.

1. A method for reducing prediction uncertainty in a prediction model associated with a patterning process, the method comprising:
    determining prediction data using the prediction model, the prediction model having been calibrated with calibration data;
    determining a prediction uncertainty parameter based on the prediction data, the prediction uncertainty parameter associated with variation in the prediction data;
    selecting a subset of patterning process data based on the prediction uncertainty parameter;
    recalibrating the prediction model using the calibration data and the selected subset of the patterning process data; and
    determining one or more semiconductor device manufacturing process parameters based on predictions from the recalibrated prediction model.
2. The method of clause 1, further comprising iteratively repeating the determining prediction data, determining the prediction uncertainty parameter, selecting, and recalibrating steps until the prediction model converges.
3. The method of clause 2, wherein model convergence comprises a model error breaching a model error threshold level, the model error being a difference between a reference geometry and a simulated geometry generated from a simulation of the patterning process by the prediction model.
4. The method of clause 3, wherein the reference geometry is a measured geometry from a scanning electron microscope.
5. The method of clause 1, wherein the prediction uncertainty parameter is associated with at least one of:
    a value of critical dimension of a substrate;
    a curvature associated with a pattern of the patterning process;
    an intensity used in the patterning process; and
    an image slope associated with a pattern of the patterning process.
6. The method of clause 1, wherein the one or more determined semiconductor device manufacturing process parameters comprise one or more of a mask design, a pupil shape, a dose, or a focus.
7. The method of clause 1, wherein the one or more determined semiconductor device manufacturing process parameters comprise a mask design, and wherein the method further comprises adjusting the mask design from a first mask design to a second mask design based on the predictions from the recalibrated prediction model.
8. The method of clause 1, further comprising determining an adjustment for a semiconductor device manufacturing apparatus based on the one or more determined semiconductor device manufacturing parameters.
9. The method of clause 1, further comprising determining an adjustment for a semiconductor device manufacturing process based on the one or more determined semiconductor device manufacturing parameters.
10. The method of clause 9, further comprising adjusting the semiconductor device manufacturing apparatus based on the determined adjustment.
11. The method of clause 1, wherein the calibration data comprises a calibration pattern, the calibration pattern associated with geometrical features of a pattern on a substrate, and wherein the prediction data comprises a prediction pattern, the prediction pattern associated with predicted geometrical features of the pattern on the substrate.
12. A method for reducing prediction uncertainty in a prediction model associated with a patterning process, the method comprising:
    determining a prediction uncertainty parameter based on prediction data, the prediction data determined using the prediction model associated with the patterning process, the prediction model having been calibrated with calibration data, the prediction uncertainty parameter associated with variation in the prediction data;
    selecting a subset of patterning process data based on the prediction uncertainty parameter; and
    recalibrating the prediction model using the calibration data and the selected subset of the patterning process data.
13. The method of clause 12, further comprising iteratively repeating the determining prediction data, determining the prediction uncertainty parameter, selecting, and recalibrating steps until the prediction model converges.
14. The method of clause 13, wherein model convergence comprises a model error breaching a model error threshold level, the model error being a difference between a reference geometry and a simulated geometry generated from a simulation of the patterning process by the prediction model.

15. The method of clause 14, wherein the reference geometry is a measured geometry from a scanning electron microscope.

16. The method of any of clauses 12-15, wherein the calibration data comprises a calibration pattern, the calibration pattern associated with geometrical features of a pattern on a substrate, and wherein the prediction data comprises a prediction pattern, the prediction pattern associated with predicted geometrical features of the pattern on the substrate.

17. The method of any of clauses 12-16, wherein the prediction uncertainty parameter is associated with at least one of:
    a value of critical dimension of a substrate;
    a curvature associated with a pattern of the patterning process;
    an intensity used in the patterning process; and
    an image slope associated with a pattern of the patterning process.

18. The method of any of clauses 12-17, wherein the prediction data comprises predicted pattern parameter values.

19. The method of clause 18, wherein the prediction uncertainty parameter is associated with variation in the predicted pattern parameter values.

20. The method of clause 19, wherein the prediction uncertainty parameter is determined based on the variation in the predicted pattern parameter values and fitting requirements associated with the prediction model.

21. The method of any of clauses 12-17, wherein the prediction uncertainty parameter comprises a ranking of individual patterning process data points.

22. The method of any of clauses 12-17, wherein the prediction uncertainty parameter comprises a maximum number of individual patterning process data points.

23. The method of any of clauses 12-22, wherein the prediction model is a machine learning model, and calibrating the prediction model comprises training the machine learning model.

24. The method of any of clauses 12-23, wherein recalibrating the prediction model using the calibration data and the selected subset of the prediction data reduces the prediction uncertainty in predictions from the prediction model.

25. A method for selecting data associated with a patterning process, the method comprising:
    determining prediction data using one or more the prediction models, the one or more prediction models having been calibrated with calibration data;
    determining a prediction uncertainty parameter based on the prediction data, the prediction uncertainty parameter associated with variation in the prediction data; and
    selecting a set of data based on the prediction uncertainty parameter.

26. The method of clause 25, wherein the set of data comprises a subset of patterning process data.

27. The method of clause 26, further comprising recalibrating a prediction model using the calibration data and the selected subset of the patterning process data.

28. The method of clause 27, further comprising determining one or more semiconductor device manufacturing process parameters based on a prediction from the recalibrated prediction model.

29. The method of clause 27, further comprising iteratively repeating the determining prediction data, the determining the prediction uncertainty parameter, the selecting, and the recalibrating until the recalibrated prediction model converges.

30. The method of clause 29, wherein model convergence comprises a model error breaching a model error threshold level, the model error being a difference between a reference geometry and a simulated geometry generated from a simulation of the patterning process by the prediction model.

31. The method of clause 30, wherein the reference geometry is a measured geometry from a scanning electron microscope.

32. The method of clause 25, wherein the prediction uncertainty parameter is associated with at least one selected from:
    a value of critical dimension of a substrate;
    a curvature associated with a pattern of the patterning process;
    an intensity used in the patterning process; or
    an image slope associated with a pattern of the patterning process.

33. The method of clause 25, further comprising determining one or more semiconductor device manufacturing process parameters based on the selected set of data, wherein the one or more determined semiconductor device manufacturing process parameters comprise one or more selected from: a mask design, design patterns, a pupil shape, a dose, or a focus.

34. The method of clause 25, wherein the selecting the set of data comprises selecting a set of patterns.

35. The method of clause 34, further comprising using the selected patterns to train or calibrate a prediction model.

36. The method of clause 28, wherein the one or more determined semiconductor device manufacturing process parameters comprise a mask design, and further comprising adjusting the mask design from a first mask design to a second mask design based on a prediction from the recalibrated prediction model.

37. The method of clause 25, further comprising:
    determining one or more semiconductor device manufacturing process parameters based on the selected set of data; and
    determining an adjustment for a semiconductor device manufacturing apparatus based on the one or more determined semiconductor device manufacturing parameters.

38. The method of clause 25, further comprising:
    determining one or more semiconductor device manufacturing process parameters based on the selected set of data; and
    determining an adjustment for a semiconductor device manufacturing process based on the one or more determined semiconductor device manufacturing parameters.

39. The method of clause 25, wherein the calibration data comprises a calibration pattern, the calibration pattern associated with geometrical features of a pattern on a substrate, and wherein the prediction data comprises a prediction pattern, the prediction pattern associated with predicted geometrical features of the pattern on the substrate.

40. The method of clause 39, wherein the selecting the set of data comprises selecting a set of patterns.

41. A computer program product comprising a non-transitory computer readable medium having instructions recorded thereon, the instructions when executed by a computer implementing the method of any of clause 1-40 above.

While the concepts disclosed herein may be used for wafer manufacturing on a substrate such as a silicon wafer, it shall be understood that the disclosed concepts may be used with any type of manufacturing system (e.g., those used for manufacturing on substrates other than silicon wafers). In addition, the combination and sub-combinations of disclosed elements may comprise separate embodiments.

The descriptions above are intended to be illustrative, not limiting. Thus, it will be apparent to one skilled in the art that modifications may be made as described without departing from the scope of the claims set out below.

What is claimed is:

1. A method comprising:
   determining, by a hardware computer system, prediction data using one or more the prediction models, the one or more prediction models having been calibrated with calibration data;
   determining a prediction uncertainty parameter based on the prediction data, the prediction uncertainty parameter associated with variation in the prediction data;
   selecting, based on the prediction uncertainty parameter, a set of data associated with a patterning process; and
   using the set of data to enable configuration of a prediction model that produces, in use, less uncertain or more accurate prediction data.

2. The method of claim 1, wherein the set of data comprises a subset of patterning process data.

3. The method of claim 2, wherein the using comprises recalibrating the prediction model using the calibration data and the selected subset of the patterning process data.

4. The method of claim 3, further comprising determining one or more semiconductor device manufacturing process parameters based on a prediction from the recalibrated prediction model.

5. The method of claim 4, wherein the one or more determined semiconductor device manufacturing process parameters comprise a mask design, and
   further comprising adjusting the mask design from a first mask design to a second mask design based on the prediction from the recalibrated prediction model.

6. The method of claim 4, further comprising iteratively repeating the determining prediction data, the determining the prediction uncertainty parameter, the selecting, and the recalibrating until the recalibrated prediction model converges.

7. The method of claim 6, wherein model convergence is indicated by a model error breaching a model error threshold level, the model error being a difference between a reference geometry and a simulated geometry generated from a simulation of the patterning process by the recalibrated prediction model.

8. The method of claim 7, wherein the reference geometry is a measured geometry from a scanning electron microscope.

9. The method of claim 1, wherein the prediction uncertainty parameter is associated with at least one selected from:
   a value of critical dimension of a substrate;
   a curvature associated with a pattern of the patterning process;
   an intensity used in the patterning process; or
   an image slope associated with a pattern of the patterning process.

10. The method of claim 1, further comprising determining one or more semiconductor device manufacturing process parameters based on the selected data, wherein the one or more determined semiconductor device manufacturing process parameters comprise one or more selected from: a mask design, design patterns, a pupil shape, a dose, or a focus.

11. The method of claim 1, wherein the selecting the set of data comprises selecting a set of patterns.

12. The method of claim 11, wherein the using comprises using the selected set of patterns to train or calibrate a prediction model that is a machine learning model or a non-machine learning model.

13. The method of claim 1, further comprising:
    determining one or more semiconductor device manufacturing process parameters based on the selected data; and
    determining an adjustment for a semiconductor device manufacturing apparatus based on the one or more determined semiconductor device manufacturing parameters.

14. The method of claim 1, further comprising:
    determining one or more semiconductor device manufacturing process parameters based on the selected data; and
    determining an adjustment for a semiconductor device manufacturing process based on the one or more determined semiconductor device manufacturing parameters.

15. The method of claim 1, wherein the calibration data comprises a calibration pattern, the calibration pattern associated with geometrical features of a pattern on a substrate, and wherein the prediction data comprises a prediction pattern, the prediction pattern associated with predicted geometrical features of the pattern on the substrate.

16. The method of claim 15, wherein the selecting the set of data comprises selecting a set of patterns.

17. A non-transitory computer-readable medium having instructions therein, the instructions, when executed by a computer system, configured to cause the computer system to at least:
    determining, by a hardware computer system, prediction data using one or more prediction models, the one or more prediction models having been calibrated with calibration data;
    determining a prediction uncertainty parameter based on the prediction data, the prediction uncertainty parameter associated with variation in the prediction data; and
    selecting, based on the prediction uncertainty parameter, a set of data associated with a patterning process; and
    use the set of data to enable configuration of a prediction model that produces, in use, less uncertain or more accurate prediction data.

18. The medium of claim 17, wherein the set of data comprises a subset of patterning process data.

19. The medium of claim 18, wherein the instructions configured to cause the computer system to use the set of data are further configured to cause the computer system to recalibrate a prediction model using the calibration data and the selected subset of the patterning process data.

20. The medium of claim 19, wherein the instructions are further configured to cause the computer system to determine one or more semiconductor device manufacturing process parameters based on a prediction from the recalibrated prediction model.

* * * * *